US008671380B2

(12) United States Patent
Wang et al.

(10) Patent No.: US 8,671,380 B2
(45) Date of Patent: Mar. 11, 2014

(54) DYNAMIC FREQUENCY CONTROL USING COARSE CLOCK GATING

(75) Inventors: James Wang, Vista, CA (US); Patrick Y. Law, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 140 days.

(21) Appl. No.: 13/429,800

(22) Filed: Mar. 26, 2012

(65) Prior Publication Data

US 2013/0021072 A1   Jan. 24, 2013

Related U.S. Application Data

(60) Provisional application No. 61/508,878, filed on Jul. 18, 2011.

(51) Int. Cl.
*G06F 9/455* (2006.01)
*G06F 17/50* (2006.01)

(52) U.S. Cl.
USPC ........... 716/133; 716/104; 716/134; 327/172; 327/173; 327/174; 327/175; 327/176

(58) Field of Classification Search
USPC .......... 706/104, 133, 134; 327/291, 158, 161, 327/172, 173, 174, 175, 176, 124, 155; 713/320, 322, 324, 400, 500, 600
See application file for complete search history.

(56) References Cited

U.S. PATENT DOCUMENTS

| 5,408,640 | A | | 4/1995 | Macintyre et al. |
| 5,600,824 | A | | 2/1997 | Williams et al. |
| 5,757,218 | A | * | 5/1998 | Blum ............................. 327/175 |
| 6,055,207 | A | * | 4/2000 | Nam ......................... 365/233.14 |
| 6,983,389 | B1 | * | 1/2006 | Filippo .......................... 713/324 |
| 7,225,421 | B2 | | 5/2007 | Migatz et al. |
| 7,327,180 | B2 | * | 2/2008 | Yamaguchi .................... 327/293 |

(Continued)

FOREIGN PATENT DOCUMENTS

GB    2456202    7/2009

OTHER PUBLICATIONS

International Search Report and Written Opinion in application No. PCT/US12/46080 mailed Sep. 12, 2012.

(Continued)

*Primary Examiner* — Jack Chiang
*Assistant Examiner* — Brian Ngo
(74) *Attorney, Agent, or Firm* — Lawrence J. Merkel; Erik A. Heter; Meyertons, Hood, Kivlin, Kowert & Goetzel, P.C.

(57) ABSTRACT

A method and apparatus for controlling the frequency of a clock signal using a clock-gating circuit is disclosed. In one embodiment, a root clock signal and an enable signal are provided to a clock-gating circuit. The clock-gating circuit is configured to provide an operational clock signal (based on the root clock signal) when the enable signal is asserted. The operational clock signal is inhibited when the enable signal is de-asserted. The frequency of the operational clock signal can be output at a reduced frequency (relative to the root clock signal) by asserting the enable signal for one of every N clock cycles. Furthermore, the frequency of the operational clock signal can be dynamically changed by changing the rate of asserting the enable signal relative to the root clock signal, without suspending operation of a functional unit receiving the operational clock signal.

21 Claims, 6 Drawing Sheets

(56) References Cited

U.S. PATENT DOCUMENTS

| | | |
|---|---|---|
| 7,562,325 B1 | 7/2009 | Arbel et al. |
| 7,616,043 B2 | 11/2009 | Takano |
| 7,702,944 B2 | 4/2010 | Chelstrom et al. |
| 2003/0149905 A1* | 8/2003 | Santhanam et al. .......... 713/500 |
| 2005/0156648 A1* | 7/2005 | Yamaguchi ................... 327/291 |
| 2006/0288248 A1* | 12/2006 | Yamaguchi ................... 713/400 |
| 2007/0120587 A1* | 5/2007 | Haerle et al. ................. 327/158 |
| 2009/0172458 A1* | 7/2009 | Yamada et al. ............... 713/600 |
| 2010/0117697 A1 | 5/2010 | Kanno et al. |
| 2010/0162063 A1* | 6/2010 | Teyssier et al. ............... 714/735 |
| 2010/0231282 A1 | 9/2010 | Singasani |
| 2011/0302339 A1* | 12/2011 | Umezawa ....................... 710/52 |
| 2012/0139590 A1* | 6/2012 | Myers et al. .................. 327/113 |
| 2012/0286883 A1* | 11/2012 | Horel .............................. 331/55 |
| 2013/0191677 A1* | 7/2013 | Ziesler et al. ................. 713/500 |

OTHER PUBLICATIONS

Office Action and translation thereof in corresponding Japanese Application No. 2012-173368, Dec. 11, 2013, pp. 1-5.
Office Action from Korean Patent Application No. 10-2012-78403, mailed Dec. 12, 2013, Korean and English Versions, pp. 1-9.

* cited by examiner

DYNAMIC FREQUENCY CONTROL USING COARSE CLOCK GATING

PRIORITY:

This application claims priority to U.S. Provisional Patent Application 61/508,878, filed on Jul. 18, 2011.

BACKGROUND

1 Field of the Invention

This invention relates to integrated circuits, and more particularly, the control of clock signals distributed in integrated circuits.

2. Description of the Related Art

Clock-gating is a power saving technique that is employed in a wide variety of integrated circuits (ICs). In an IC operable to perform clock-gating, extra hardware in the form of clock-gating logic is added to various points of a clock tree that is used to distribute a clock signal. A point of a clock tree used to distribute the clock signal directly to circuitry (e.g., flop circuits) may be referred to as a "leaf" node. Accordingly, clock-gating logic may be placed at the leaf node. The clock-gating logic of each leaf node may be coupled to receive an enable signal that, when asserted, enables the clock signal to be provided to the clock circuitry associated with that leaf node. The enable signal may be de-asserted to inhibit the clock signal from being provided to circuitry coupled to a corresponding leaf node when that circuitry is idle, thereby saving power.

Another power-saving technique that involves the clock signal is frequency scaling. Frequency scaling is a technique by which the clock frequency may be changed depending on a processing workload. When the processing workload is higher, a system using frequency scaling may operate at a higher clock frequency. If the workload is reduced, the clock frequency may be correspondingly reduced. Changing the clock frequency may be accomplished by momentarily suspending processing operations, changing the clock frequency at its source (e.g., at a phase locked loop), and then resuming operations once the clock signal is cycling stably at its new frequency.

SUMMARY

A method and apparatus for dynamically changing a clock frequency using a clock-gating unit is disclosed. In one embodiment, an integrated circuit (IC) includes a clock tree having a number of leaf nodes. The clock tree is coupled to distribute a clock signal to a number of synchronous circuits coupled to each of the plurality of leaf nodes. Each of one or more functional blocks of the IC includes at least a subset of the number of leaf nodes and their correspondingly coupled synchronous circuits. A coarse clock-gating unit is coupled to receive the root clock signal and an enable signal, and is coupled to provide an operational clock signal to the leaf nodes (and thus the synchronous circuits) of the functional unit. The coarse clock-gating unit may output the operational clock signal at the same frequency of the root clock signal when the enable signal is asserted. The coarse clock-gating unit may inhibit the operational clock signal when the enable signal is de-asserted. Furthermore, by asserting the enable signal for one of every N clock cycles, the operational clock signal may be output at a clock frequency that is reduced with respect to the frequency of the root clock signal. Furthermore, the frequency of the clock signal may be changed dynamically (i.e. "on the fly") without having to suspend operation of the functional unit to which it is provided.

In one embodiment, an IC includes a clock generation unit that generates a root clock signal provided to a clock tree. The IC includes one or more functional units. One or more coarse-clock gating units are coupled to receive the root clock signal. Each of the one or more coarse clock-gating units is coupled to provide a corresponding operational clock signal to an associated one of the one or more functional units. The clock tree includes a plurality of leaf nodes, each of which is associated with a fine-grain clock-gating unit coupled to distribute the operational clock to one or more synchronous circuits coupled thereto. Each of the functional units includes a unique subset of the plurality of leaf nodes. Each of the fine grain clock-gating units is configured to perform clock gating of the received operational clock signal. Similarly, the coarse clock-gating units may perform clock gating for their respective functional units.

Each of the coarse and fine grain clock-gating units is coupled to receive a corresponding enable signal from a clock control unit. The clock control unit can inhibit the operational clock signal from being output by a given clock-gating unit by de-asserting its respective enable signal. The clock control unit can enable the operational clock signal to be provided from a given clock-gating unit by asserting its respective enable signal. In addition, the clock control unit may alter the duty cycle of the operational clock signal output by a given one of the coarse clock-gating units by asserting its respective clock enable signal only one of every N cycles of the root clock signal. Changing the duty cycle of the operational clock signal output by a given coarse clock-gating unit may effectively change the frequency of that instance of the operational clock signal. Accordingly, the clock control unit may enable power savings by reducing the frequency of an instance of the operational clock signal as output by a coarse clock-gating unit when the corresponding functional unit is active but otherwise not processing a large workload. If the synchronous circuits coupled to a fine grain clock-gating unit are idle, the clock control unit may inhibit the operational clock signal from being provided, providing power savings in that manner. Similarly, if all synchronous circuits of a functional unit are idle, the clock control unit may inhibit the operational clock that is output from the corresponding coarse grain clock-gating unit.

BRIEF DESCRIPTION OF THE DRAWINGS

The following detailed description makes reference to the accompanying drawings, which are now briefly described.

Figure 1:
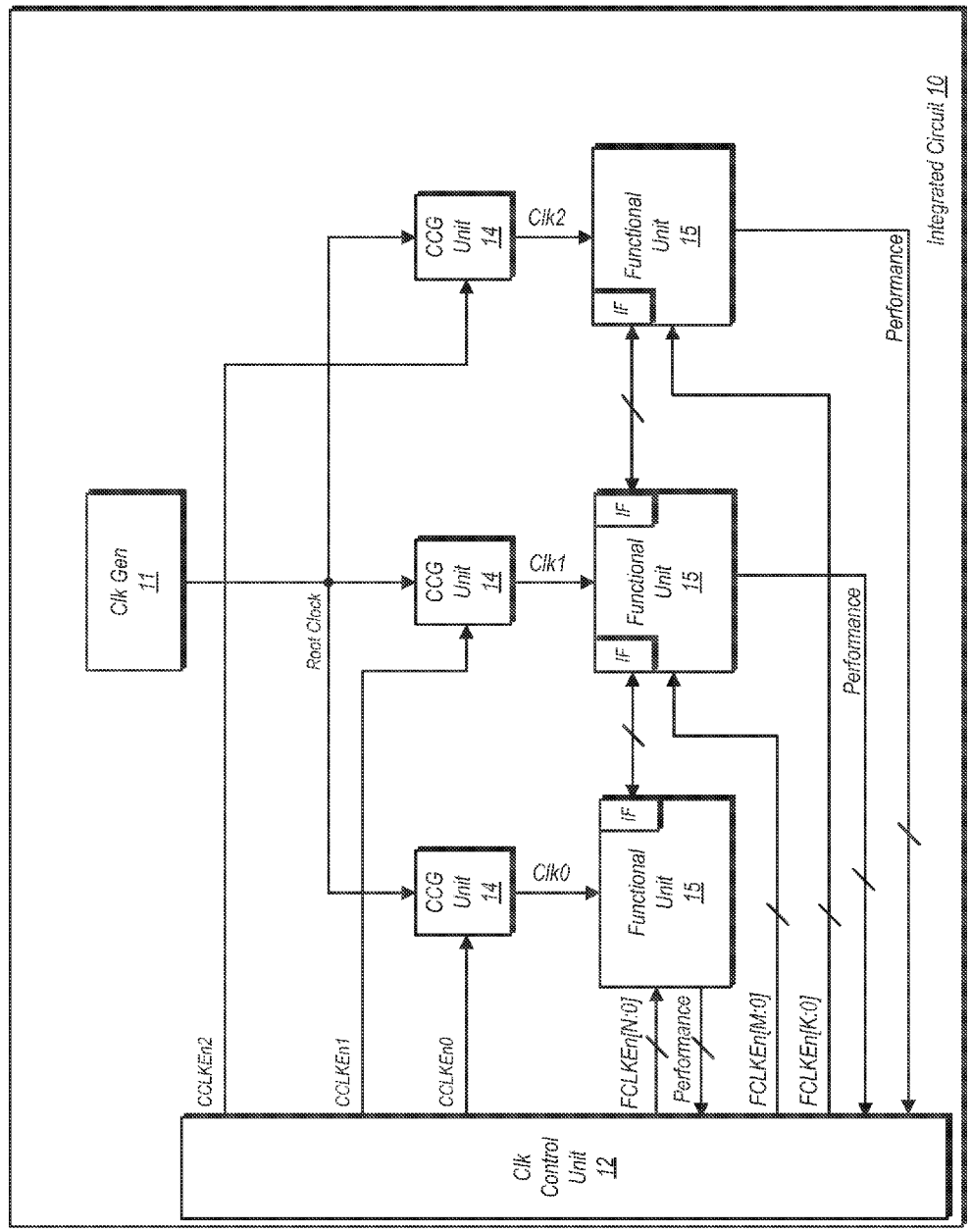
FIG. 1 is a block diagram of one embodiment of an integrated circuit (IC).

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Integrated Circuit:

FIG. 1 is a block diagram of one embodiment of an integrated circuit (IC). In the embodiment shown, IC 10 includes a clock generation unit 11 that is coupled to generate a root clock signal. The root clock signal is a global clock signal that may be routed to each of a number of functional units 15 via corresponding coarse clock-gating units 14. The clock signal is distributed to functional units 15 (and thus the circuitry therein of each) via a clock tree that is not shown here for the sake of simplicity, but will be discussed further in reference to FIG. 2.

Each of the coarse clock-gating units 14 is coupled to receive a respective clock enable signal from clock control unit 12. When an enable signal is asserted to a respective coarse clock-gating unit 14, the clock signal is passed for distribution to the corresponding functional unit 15. If the enable signal is de-asserted, the respective coarse clock-gating unit 14 may inhibit the clock signal from being provided to the corresponding functional unit 15. For example, if clock control unit 12 asserts the CCLKEn0 signal, the corresponding coarse clock-gating unit 14 may provide Clk0 to the respectively coupled functional unit 15. If the CCLKEn0 signal is de-asserted by clock control unit 12, then no clock signal is provided to the corresponding functional unit 15. As will be discussed in further detail below, clock control unit 12 may also dynamically (i.e. "on the fly") change the frequency of a clock signal provided by a given coarse clock-gating unit by toggling its respectively received clock enable signal.

Each functional unit 15 in the embodiment shown includes a number of different synchronous circuits. A given one of any of these synchronous circuits may be a latch, a flip-flop, or any other circuit that operates according to a clock signal. Each functional unit 15 may also include a number of fine grain clock-gating units. Each fine-grain clock-gating unit may be associated with one or more synchronous circuits. Clock control unit 12 may provide corresponding groups enable signals (e.g., FLCKE [N:0]) to each functional unit 15, with each fine grain clock-gating unit receiving one of the enable signals. These enable signals may be asserted or de-asserted in order to enable or inhibit the clock signal from being provided to respective synchronous circuits.

Each of the functional units 15 in the embodiment shown is coupled to signals indicative of performance (Performance' signal as shown) to clock control unit 12. Such indications may include indication of processing workload, memory requests, cache requests and/or cache hits, and virtually any other type of information that may indicate a performance demand for a particular functional unit 15. Based on the received indications, clock control unit 12 may take various actions to control the clock signals to optimize the balance between performance and power consumption. For example, if some synchronous circuits (or groups thereof) of a functional unit 15 are completely idle, while other synchronous circuits are busy, clock control unit 12 may de-assert corresponding clock enable signals provided to respective fine grain clock-gating units. This may in turn inhibit the clock signal provided to the idle synchronous circuits, thereby resulting in lower power consumption. If all circuits of a given functional unit 15 are idle, clock control unit 15 may de-assert a corresponding enable signal provided to the respective coarse clock-gating unit 14. This may inhibit the clock signal from being provided to the entirety of the idle functional unit 15, which may result in even greater power savings.

In some cases, a given functional unit 15 may be active, but may nevertheless have a low performance demand. For example, consider a situation in which a given functional unit 15 has made a number of requests for information from another one of functional units 15 (or to an agent external to IC 10). In such a case, there may be significant latency in satisfying such requests. Accordingly, the functional unit 15 that initiated the requests may have no other work to perform while waiting for the requested information to be returned. In such a situation, clock control unit 12 may reduce the frequency of the clock signal provided to that particular functional unit 15. More particularly, clock control unit 12 may enable the clock signal output from a corresponding coarse clock-gating unit 14 for one of every N cycles of the root clock signal. For example, clock control unit 12 could effectively reduce the frequency of a clock signal output by a coarse clock-gating unit 14 by asserting the enable signal for only one of every four cycles of the root clock signal. This in turn results in the coarse clock-gating unit 14 outputting a clock signal having effectively ¼ the frequency of the root clock signal. The duty cycle of the same clock signal is ⅛ that of the root clock signal. By reducing the effective frequency and duty cycle of the clock signal provided to a functional unit 15 having a reduced performance demand while otherwise being non-idle, power consumption associated with the clock signal received thereby may be reduced. It is noted that clock control unit 12 may effect a change of frequency of a clock signal provided from a particular coarse clock-gating unit dynamically, without suspending operation of the corresponding functional unit 15. This may prevent a loss of performance of IC 10 that might otherwise be incurred if a change of clock frequency was accompanied by a suspension of operation. It is noted that the coarse clock-gating units 14 are shown here as being implemented in a distributed manner. However, embodiments wherein the coarse-clock gating units 14 are implemented in a single block are also possible and contemplated. When the coarse clock-gating units are implemented in the distributed arrangement as shown, a 1/M (where M is multiple of N) duty cycle clock synchronization signal may be distributed among all coarse clock-gating units 14. The 1/M duty cycle clock synchronization signal may be used to synchronize the 1/N periods between each of the coarse clock-gating units. This may enable synchronous communications between each of the functional units 15. For the sake of simplicity, signal connections for the 1/M duty cycle clock synchronization signal are not shown here, although they are understood to be otherwise present in the illustrated embodiment.

In the embodiment shown, each of the functional units 15 includes at least one interface ('IF') coupling it to at least one other one of the functional units 15. Although not explicitly shown, one or more of the functional units may also include an interface to one or more agents external to IC 10. Each interface may include connections for a specified set of signals that are to be conveyed between two coupled functional units 15. In some cases, the interfaces may be arranged accordingly to a previously defined protocol for communications between two different functional units. The interfaces may also include connections for handshake signals to be conveyed between two functional units 15 that are coupled together. The handshake signals may be used to convey handshaking information necessary to synchronize operation between two functional units 15, including situations in which the functional units 15 are operating at different clock frequencies with respect to one another. Handshaking may further be used to ensure that two functional units 15 operating at a reduced clock frequency have their respectively received clock signals enabled on the same clock cycle. If two functional units 15 operating at a reduced frequency do not have their respective clock signals enabled on the same cycle, clock control unit 12 may change the pattern in which a corresponding enable signal is asserted for at least one coarse clock-gating unit 14 to bring both clock signals into alignment (i.e. the corresponding clock enable signals are asserted on the same cycle of the root clock signal). In some embodiments, clock control unit 12 may be configured to synchronize the enable signals provided to each of the coarse clock-gating units such that they are each asserted on the same root clock cycle when operating at a reduced frequency.

Figure 2:
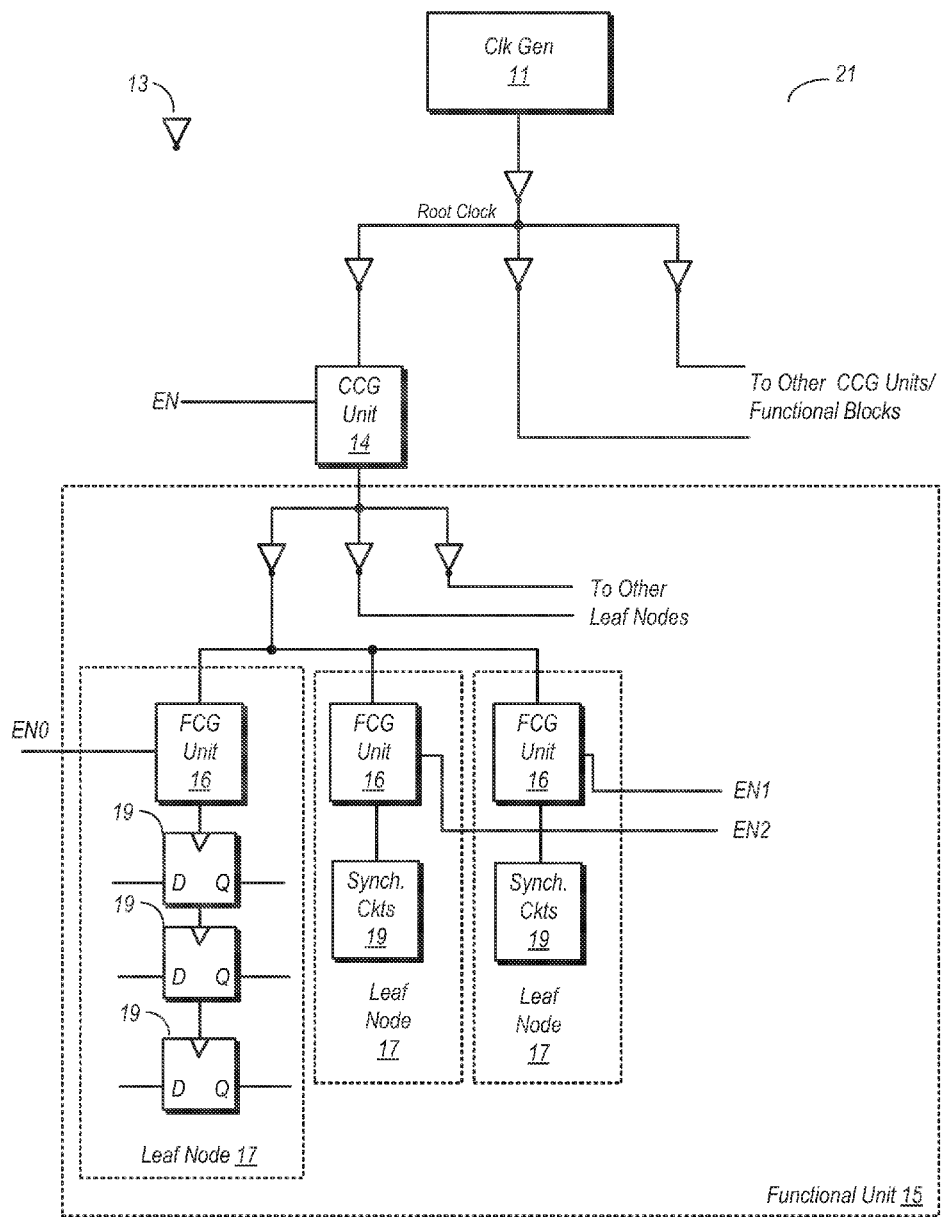
FIG. 2 is a diagram illustrating one embodiment of a clock tree for an IC.

Clock Tree:

Turning now to FIG. 2, a diagram illustrating one embodiment of a clock tree that may be implemented in IC 10 is shown. In the illustrated embodiment, clock generator 11 is configured to generate a clock signal that is conveyed to the root clock signal node, via clock driver 13. Clock generator 11 may be any suitable type of clock generating circuit, such as a phase locked loop (PLL) or a ring oscillator.

The root clock signal may be distributed, via additional instances of inverter 13, to various instances of a coarse clock-gating unit 14 (only one of which is shown here for the sake of illustration). Each coarse clock-gating unit 14 is coupled to output a respective clock signal to a corresponding instance of functional unit 15. The clock signal output by each coarse clock-gating unit 14 may be provided to, via another inverter 13, to a number of different leaf nodes 17 in each of functional units 15. Each of the leaf nodes 17 includes a fine grain clock-gating unit 16 and one or more synchronous circuits 19. The synchronous circuits 19 may include flip-flops, latches, and/or other types of circuits that operate in accordance with a clock signal.

Each fine grain clock-gating unit 16 may have as few as one synchronous circuit 19 coupled thereto. Each of the fine grain clock-gating 16 units may also receive a corresponding enable signal (e.g., EN0), each of which may be asserted and de-asserted independent of the others. Clock control unit 12 may inhibit a clock from being provided to the synchronous circuits 19 of any leaf node 17 by de-asserting the corresponding enable signal. This may enable fine grain power savings. When a given enable signal is asserted, its corresponding fine grain clock-gating unit 16 may allow the clock signal to be provided to the synchronous circuits coupled thereto. Although not explicitly shown, functional unit 15 may include performance-monitoring circuitry coupled to each of the leaf nodes and configured to determine if its corresponding synchronous circuits 19 are active or inactive. This information may be provided with the performance information as discussed above.

As previously noted, clock tree 21 may include a number of inverters 13 in the various clock distribution branches. Embodiments in which non-inverting buffers are used instead of inverters are possible and contemplated. In either case, the use of the inverters/buffers may be used to control the skew of the clock signals distributed among the various leaf nodes 17 so that the clock edges are substantially aligned from one leaf node 17 to the next, as well as from one functional unit 15 to the next.

Figure 3:
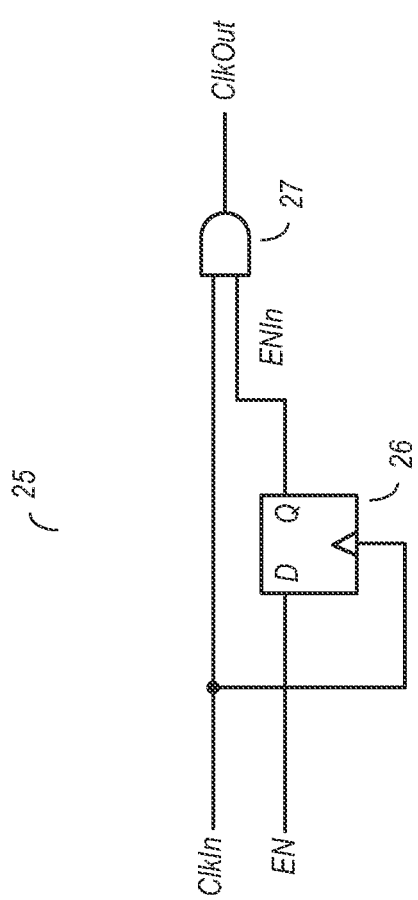
FIG. 3 is a diagram illustrating one embodiment of a clock-gating unit.

Exemplary Clock-Gating Unit:

FIG. 3 is a logic diagram of one embodiment of a clock-gating unit. The configuration of clock-gating unit 25 shown in FIG. 3 may be used to implement the coarse clock-gating units 14 and the fine grain clock-gating units 16 discussed above. However, it is noted that in some embodiments, the coarse and fine grain clock-gating units may be implemented using different configurations.

Clock-gating unit 25 in the embodiment shown includes a latch 26 and an AND gate 27. Latch 26 in the embodiment shown is a level-sensitive latch that is coupled to receive the enable signal ('EN') on its 'D' input and the input clock signal ('ClkIn') on its clock input. The output of latch 26 is a synchronized enable signal ('EnIn') that is provided as the second input to AND gate 27. When the synchronized enable signal provided to AND gate 27 is high, the output of clock-gating unit 25 (from AND gate 27) follows the state of the input clock signal. Otherwise, the output clock signal is low.

It is noted that the configuration of clock-gating unit 25 shown in FIG. 3 is only one of a number of possible configurations for clock-gating circuits. For example, a clock-gating circuit utilizing a passgate that is turned on or off according to an enable signal is possible and contemplated, with the clock signal passing through when the enable signal is asserted. In another embodiment, a simple AND gate without a latch is possible and contemplated for use as a clock-gating circuit.

Figure 4:
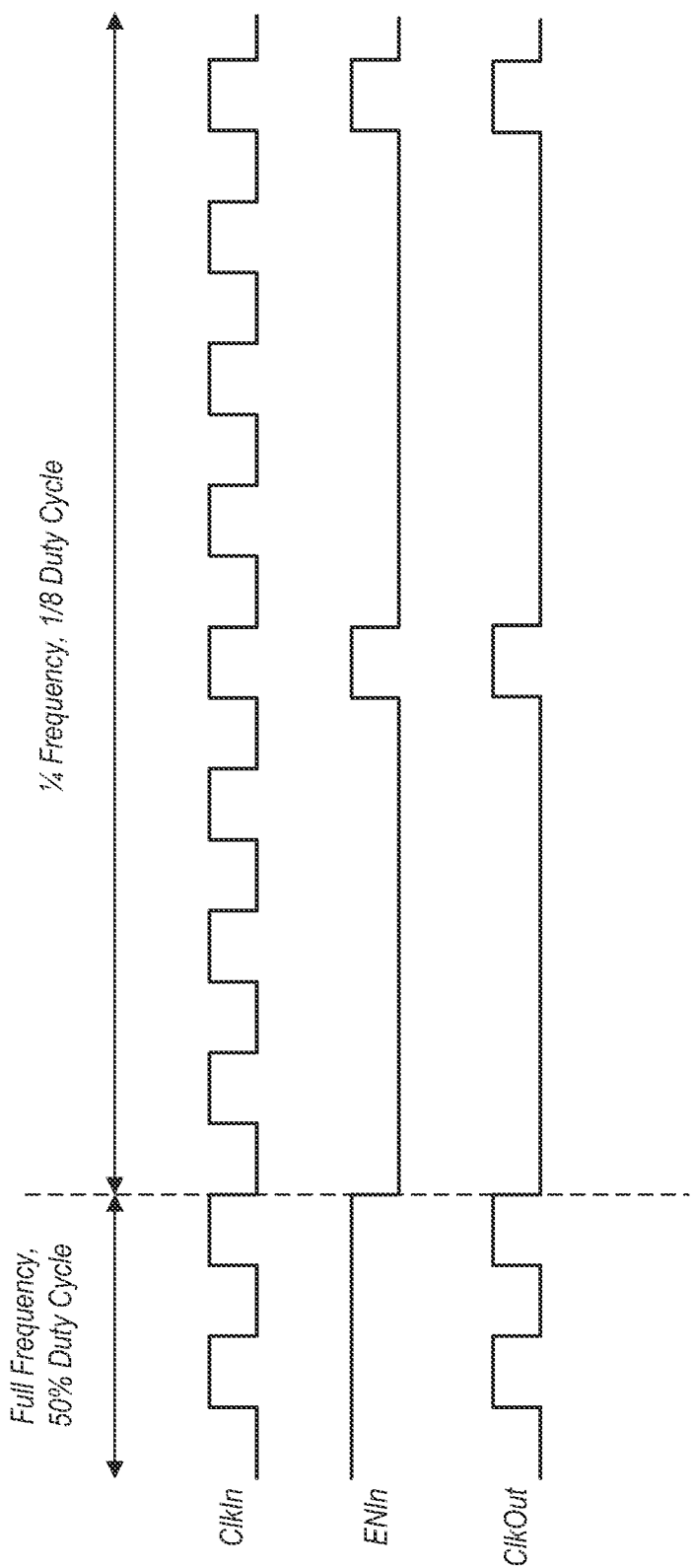
FIG. 4 is a timing diagram illustrating the use of a clock-gating unit to change the frequency of a clock signal.

Timing Diagram:

FIG. 4 is a timing diagram that illustrates the use of the clock-gating unit to alter the frequency of an output clock signal relative to an input clock signal. On the left-hand side of the diagram, the enable signal ('ENIn') is held asserted. In such a case, the output clock signal ('ClkOut') follows the input clock signal ('ClkIn'), and has the same frequency and duty cycle (50% in this case).

Moving to the right hand side of the timing diagram, the enable signal is held de-asserted for three of every four clock signals and asserted for one of every fourth. As a result, the output clock signal transitions high for only one of every four cycles. In effect, the output clock signal follows the enable signal in this case. The frequency of the output clock signal in this example is ¼ that of the input clock signal, while the duty cycle is ⅛. In general, for a given value of N, when the clock enable signal provided to a clock gating unit may be provided at a duty cycle of 1/N to produce a clock signal having an effective frequency of 1/N of the base frequency. The duty cycle of the reduced clock frequency signal may be ½N.

It is noted that changing between the two different output clock frequencies as shown in the illustrated example may be accomplished dynamically by various embodiments of the hardware discussed above. For example, if clock control unit 12 of FIG. 1 determines that a given functional unit 15 may operate at the lower clock frequency, it may de-assert the enable signal provided to its corresponding coarse clock-gating unit 14, and begin asserting it for only one of every N clock cycles. For the remaining N-1 clock signals, the enable signal may remain de-asserted. Since the change may be put into effect by the assertion/de-assertion pattern of the enable signal, it is not necessary to suspend operations of the corresponding functional unit 15 to accomplish the frequency change. Furthermore, the return to the full frequency of the input clock signal may be accomplished by asserting the enable signal and holding at that state.

It is noted that the illustrated example is directed to only two clock frequencies, the full frequency and the reduced frequency that is ¼ that of the full frequency. However, embodiments are possible and contemplated where additional clock frequencies are possible. For example, a clock control unit could allow the output clock signal to cycle at the full frequency, at ½ the full frequency (by asserting the enable signal one of every two clock cycles) or ¼ the frequency as shown. Additionally, it is also possible to achieve various effective frequencies by enabling clock in full frequency and 1/N frequency in various mixed sequences of the two different duty cycles. Furthermore, the value of N may be fixed in some embodiments to simplify the design of the clock gating units. A fixed value of N may also simplify the synchronization of clock signals across the various coarse clock gating units.

Figure 5:
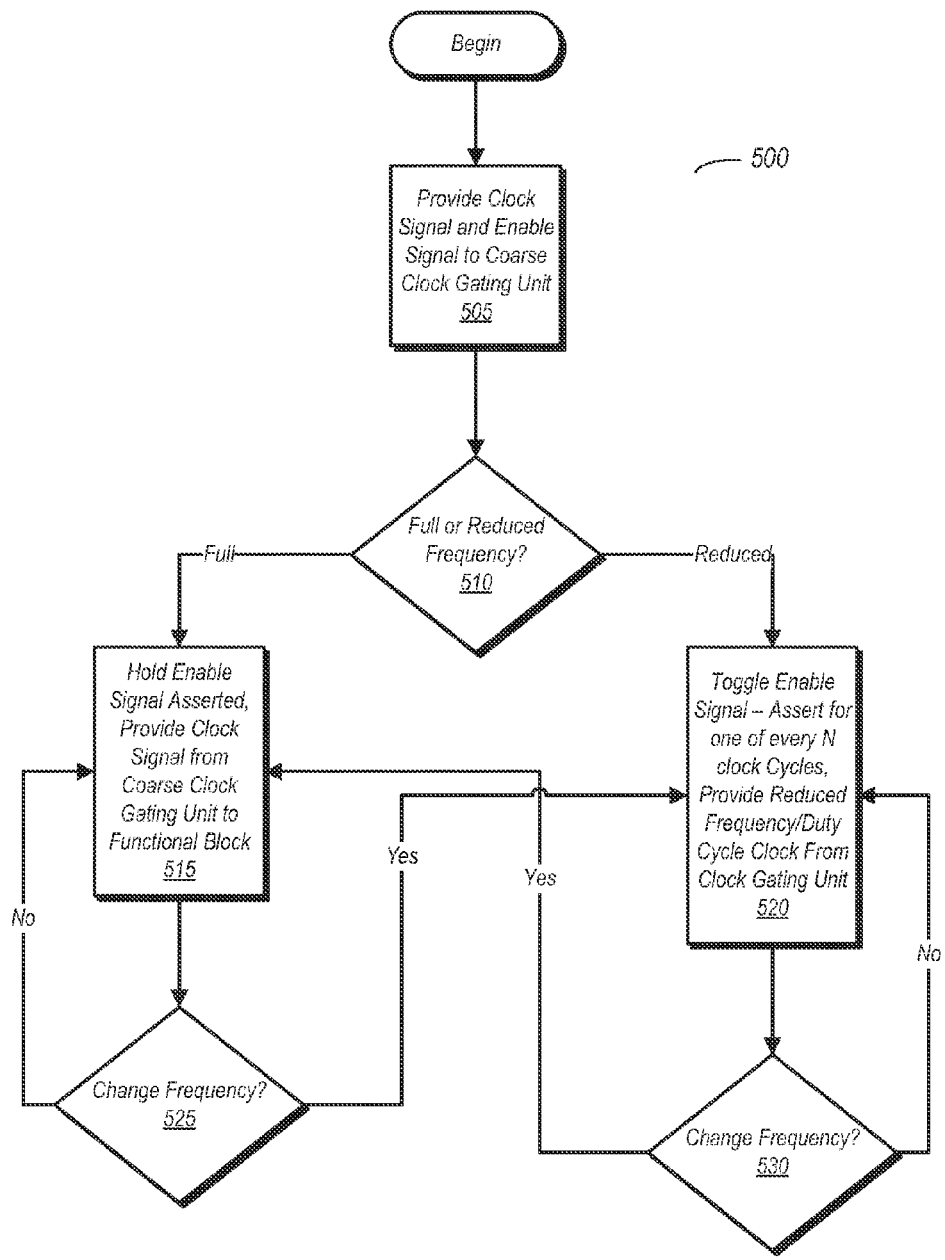
FIG. 5 is a flow diagram illustrating one embodiment of a method for changing the frequency of a clock signal.

Method Flow Diagram:

Turning now to FIG. 5, a flow diagram for one embodiment of a method for changing the frequency of a clock signal output by a clock-gating unit is shown. In the embodiment shown, method 500 begins with the provision of an input clock signal and an enable signal to a coarse clock-gating unit (block 505). The coarse clock-gating unit may be coupled to provide an output clock signal to a correspondingly coupled functional unit when the enable signal is asserted. The output clock signal may be inhibited from being provided to the functional unit when the enable signal is held in a de-asserted state. When the enable signal is periodically toggled between its asserted and de-asserted states, the coarse clock-gating unit may effectively provide an output clock signal to the functional unit that has a lower frequency and smaller duty cycle than the full frequency and duty cycle of the input clock signal.

If the output clock signal is to be provided at the full frequency (block 510, full), then the enable signal may be held in an asserted state (block 515). The clock signal may be provided to the corresponding functional unit at the full frequency (e.g., the same frequency as the input clock signal) and duty cycle (block 515). If the output clock signal is to be provided at a reduced frequency (block 510, reduced), then the enable signal may be toggled (block 520). Moreover, the enable signal may be asserted for one of every N cycles of the input clock signal, and de-asserted for the remaining N-1 clock cycles of the input signal. The value of N may be an integer value greater than one. By asserting the enable signal in a periodic manner as described herein, the output clock signal may be effectively provided at a reduced frequency and duty cycle relative to the input clock signal.

If, when operating at the full clock frequency, if it is determined that the output clock frequency is to be reduced (block 525, yes), then the method may transfer to block 520. Otherwise, the enable signal may remain asserted and the output clock signal may be provided in accordance with block 515. If, when operating at the reduced clock frequency, it is determine that the clock frequency is to be returned to the full clock frequency (block 530, yes), then the method transfers to block 515, ceasing the periodic assertions of the enable signal and instead holding the enable signal as asserted. Otherwise, the method continues providing the output clock signal at the reduced frequency in accordance with block 520. Changed to the output clock frequency (reducing and increasing) may be performed dynamically without any suspension of operation of the receiving functional unit while the frequency change is being made.

While the method in the illustrated embodiment is performed for only two frequencies (full and one reduced frequency), it is noted that the method may be modified to accommodate additional clock frequencies. For example, a method is contemplated where the output clock may be provided at the same frequency as the input clock signal (e.g., the full clock frequency), at a first reduced frequency (e.g., ½ the input clock frequency), and a second reduced frequency (e.g., at ¼ the input clock frequency). Changes between these frequencies may be accomplished by changing the patterns at which the enable signal is asserted and de-asserted. For the full clock frequency, the enable signal may be held asserted. For an output clock signal at ½ the full frequency, the enable signal may be asserted for one of every two cycles of the input clock signal, and de-asserted for the other one of every two cycles. For an output clock signal at ¼ the full frequency, the enable signal may be asserted for one of every four input clock cycles and de-asserted for the other three of every four input clock cycles.

Figure 6:
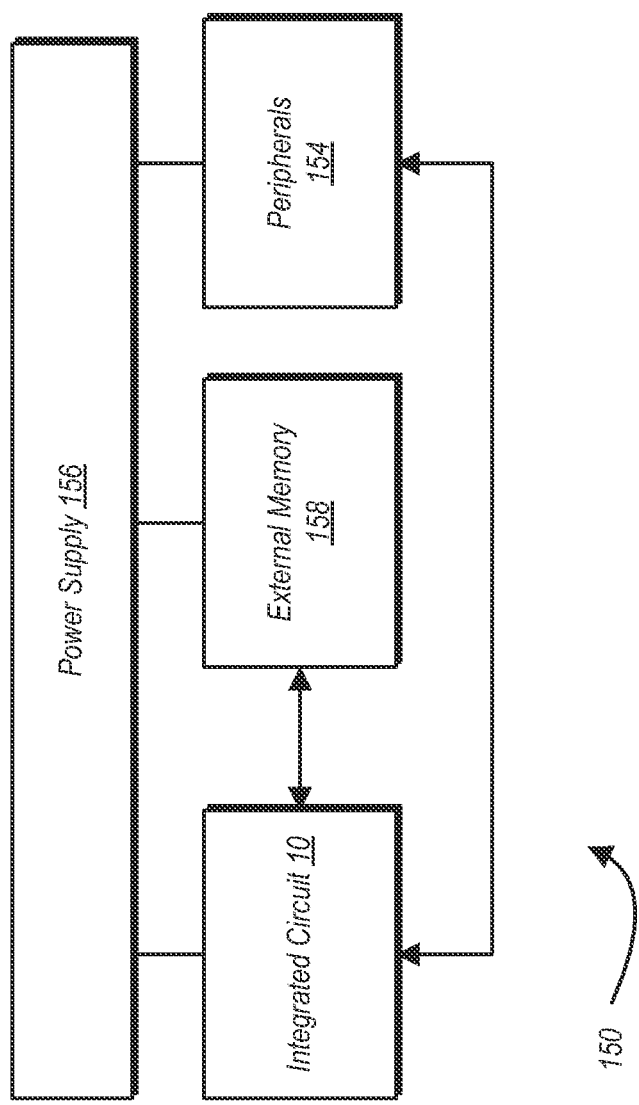
FIG. 6 is a block diagram of one embodiment of a system.

Exemplary System:

Turning next to FIG. 6, a block diagram of one embodiment of a system 150 is shown. In the illustrated embodiment, the system 150 includes at least one instance of an IC 10 (e.g., from FIG. 1) coupled to one or more peripherals 154 and an external memory 158. A power supply 156 is also provided which supplies the supply voltages to the IC 10 as well as one or more supply voltages to the memory 158 and/or the peripherals 154. In some embodiments, more than one instance of the IC 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMM5), etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
a clock tree coupled to distribute a clock signal to each of a plurality of leaf nodes, wherein each leaf node is coupled to one or more synchronous circuits;
a plurality of fine-grain clock gating units, wherein each of the plurality of fine-grain clock gating units is configured to gate the clock signal provided to each of the one or more synchronous circuits of a corresponding one of the plurality of leaf nodes;
a functional unit including a number of the plurality of fine-grain clock gating units in a subset of the plurality of leaf nodes;
a coarse clock gating unit configured to gate the clock signal for each of the subset of the plurality of leaf nodes;
a gating control unit coupled to the coarse clock gating unit, wherein the gating control unit is configured to selectively control a frequency of the clock signal provided to each of the subset of the plurality of leaf nodes by enabling one of every N cycles of the clock signal and inhibiting N-1 of every N cycles of the clock signal, wherein N is an integer value that is greater than one; and wherein the gating control unit is configured to dynamically change the frequency without suspending operation of the functional unit.

2. The apparatus as recited in claim 1, further comprising a clock generation unit configured to generate the clock signal.

3. The apparatus as recited in claim 1, wherein the gating control unit is further coupled to provide respective enable signals to each of the fine-grain clock gating units, wherein each of the fine-grain clock units is configured to provide the clock signal to respectively coupled synchronous circuits when its respective enable signal is asserted, and further configured to inhibit the clock signal from being provided to the respectively coupled synchronous circuits when its respective enable signal is de-asserted.

4. The apparatus as recited in claim 1, wherein the synchronous circuits includes at least one flop circuit and at least one latch.

5. The apparatus as recited in claim 1, wherein the coarse clock-gating unit and each of the fine-grain clock gating units includes a latch coupled to receive the enable signal and the clock signal, and an AND gate having a first input coupled to receive the enable signal from the latch and a second input coupled to receive the clock signal.

6. A method comprising:
providing a first clock signal to a coarse clock-gating unit, wherein the coarse clock gating unit is coupled to distribute a second clock signal that is based on the first clock signal to a plurality of leaf nodes of a clock tree, wherein each of the leaf nodes is associated with a corresponding fine-grain clock gating unit coupled to distribute, when enabled, the clock signal to each of a corresponding one or more synchronous circuits within a functional unit, each functional unit including a number of the fine-grain clock gating units in a subset of the plurality of leaf nodes, wherein the first clock signal has a first frequency and the second clock signal has a second clock frequency;
providing a coarse-gating enable signal to the coarse clock-gating unit, wherein the coarse clock gating unit is configured to output the second clock signal when the coarse-gating enable signal is asserted and is further configured to inhibit the second clock signal when the coarse-gating enable signal is de-asserted;
causing the second clock frequency to be less than the first clock frequency by asserting the coarse-gating enable signal for one of every N cycles of the first clock signal and de-asserting the coarse-gating enable signal for every N-1 cycles of the first clock signal, wherein N is an integer value greater than one; and
dynamically changing, by the coarse clock gating unit, the second frequency from being equal to the first clock frequency to being less than the first clock frequency.

7. The method as recited in claim 6 further comprising a clock generation unit generating the first clock signal and providing the first clock signal to the clock tree.

8. The method as recited in claim 6, further comprising causing the first clock frequency and the second clock frequency to be equal by asserting the coarse-clock gating enable signal for each cycle of the first clock signal.

9. The method as recited in claim 6 further comprising:
continuing operation of the functional unit during said dynamically changing the second clock frequency.

10. The method as recited in claim 9, further comprising:
reducing the second clock frequency from being equal to the first clock frequency responsive to a reduction in a processing workload of the functional block; and
increasing the second clock frequency to being equal to the first clock frequency responsive to an increase in the processing workload of the functional block.

11. A method comprising:
providing a root clock signal at a first frequency to a clock-gating unit;
outputting an operational clock signal from the clock-gating unit, wherein the operational clock signal is based on the root clock signal;
providing an enable signal to the clock-gating unit;
providing the operational clock signal to a functional block that includes a number of fine-grain clock gating units in a plurality of leaf nodes of a clock tree for the root clock signal;
dynamically changing, by the clock-gating unit, the second frequency without suspending operation of the functional block;
outputting the operational clock signal at the first frequency by asserting the enable signal for each of the cycles of the root clock signal; and
outputting the operational clock signal at a second frequency that is less than the first frequency by asserting the enable signal for one of every N cycles of the root clock signal and de-asserting the enable signal for N-1 of every N cycles of the root clock signal, wherein N is an integer greater than one.

12. The method as recited in claim 11, further comprising:
changing a frequency of the operational clock signal from the first frequency to the second frequency responsive to a reduction in a workload of the functional block; and
changing the frequency of the operational clock signal from the second frequency to the first frequency responsive to an increase in the workload of the functional block.

13. The method as recited in claim 11, further comprising:
a first clock gating unit receiving the root clock signal and providing a first operational clock signal at the second frequency to a first functional block;
a second clock gating unit receiving the root clock signal and providing a second operational clock signal at the second frequency to a second functional block; and
a clock control unit asserting a first enable signal to the first clock gating unit and a second enable signal to the second clock gating unit on a same cycle of the root clock signal.

14. An integrated circuit comprising:
- a clock generation unit configured generate a global clock signal;
- a plurality of functional units, wherein each of the plurality of functional units includes a number of fine-grain clock gating units in a plurality of leaf nodes of a clock tree for the global clock signal;
- a plurality of clock gating units, wherein each of the plurality of clock gating units is coupled to a corresponding one of the plurality of functional units, wherein each of the plurality of clock gating units is coupled to receive the global clock signal and is configured to provide a corresponding operating clock signal to its corresponding functional unit; and
- a clock control unit coupled to provide a corresponding one of a plurality of enable signals to each of the plurality of clock gating units, wherein each of the clock gating units is enabled to provide its respective operating clock signal to its respective functional unit when its respectively received enable signal is asserted;
- wherein the clock control unit is further configured to dynamically change a frequency of each of the operating clock signals by alternately asserting and de-asserting the enable signals provided to each of the clock gating units, and wherein the clock control unit is configured to assert selected ones of the plurality of enable signals for one of every N cycles of the global clock signal and to de-assert the selected ones of the plurality of enable signals for N-1 of every N cycles of the global clock signal, wherein N is an integer value that is greater than one.

15. The integrated circuit as recited in claim 14, wherein each of the clock gating units is configured to:
- provide its respective operating clock signal at a same frequency as that of the global clock signal when its respectively received enable signal is held asserted;
- provide its respective operating clock signal at a frequency less than that of the global clock signal when its respectively received enable clock signal is alternately asserted and de-asserted.

16. The integrated circuit as recited in claim 14, wherein the clock gating unit is configured to selectively assert and de-assert each of the plurality of enable signals independently of one another.

17. The integrated circuit as recited in claim 14, wherein the clock control unit is configured to assert a first and second enable signals provided to first and second ones of the plurality of clock gating units on a same one of every N cycles of the global clock signal.

18. A system comprising:
- a first functional unit and a second functional unit;
- a clock generation unit configured to generate a global clock signal, wherein each of the first functional unit and the second functional unit include a number fine-grain clock gating units in a plurality of leaf nodes of a clock tree for the global clock signal;
- a first clock gating unit coupled to receive the global clock signal and to provide a first clock signal to the first functional unit;
- a second clock gating unit coupled to receive the global clock signal and to provide a second clock signal to the second functional unit;
- a clock control unit coupled to provide a first enable signal to the first clock gating unit and a second enable signal to the second clock gating unit, wherein the clock control unit is configured to dynamically change respective frequencies of the first and second clock signals by selectively asserting and de-asserting the first and second enable signals, respectively, wherein a given one of the first and second clock gating units is configured to provide the corresponding one of first and second clock signals at a frequency that is 1/N of the frequency of the global clock signal responsive to the clock control unit asserting the corresponding one of the first and second enable signals for one of every N cycles of the global clock signal and de-asserting the corresponding one of the of the first and second enable signals for N-1 of every N cycles of the global clock signal, wherein N is an integer value that is greater than one.

19. The system as recited in claim 18, wherein the first and second clock gating units are configured to provide the first and second clock signals at a frequency equivalent to a frequency of the global clock signal when the first and second enable signals are held asserted.

20. The system as recited in claim 18, wherein the first and second functional units are configured to continue operations without suspension during a change of frequency of the first and second clock signals, respectively.

21. The system as recited in claim 18, wherein the clock control unit is configured to assert and de-assert the first enable signal independent of assertion and de-assertion of the second enable signal.

* * * * *

UNITED STATES PATENT AND TRADEMARK OFFICE
CERTIFICATE OF CORRECTION

PATENT NO.        : 8,671,380 B2                                    Page 1 of 1
APPLICATION NO.   : 13/429800
DATED             : March 11, 2014
INVENTOR(S)       : James Wang et al.

It is certified that error appears in the above-identified patent and that said Letters Patent is hereby corrected as shown below:

In the Claims:

Claim 14, Column 11, Line 2, delete "configured generate" and substitute -- configured to generate --

Claim 18, Column 12, Line 8, delete "number fine-grain" and substitute -- number of fine-grain --

Claim 18, Column 12, Line 30 and 31, delete "one of the of the" and substitute -- one of the --

Signed and Sealed this
Third Day of June, 2014

Michelle K. Lee
*Deputy Director of the United States Patent and Trademark Office*